(12) United States Patent
Kwack et al.

(10) Patent No.: US 12,395,067 B2
(45) Date of Patent: Aug. 19, 2025

(54) PROTECTION CIRCUIT OF RESONANT CONVERTER AND OPERATION METHOD THEREOF

(71) Applicant: LG Electronics Inc., Seoul (KR)

(72) Inventors: Younghwan Kwack, Seoul (KR); Seongho Son, Seoul (KR); Seonho Jeon, Seoul (KR); Chuhyoung Cho, Seoul (KR); Jongseong Ji, Seoul (KR)

(73) Assignee: LG Electronics Inc., Seoul (KR)

( * ) Notice: Subject to any disclaimer, the term of this patent is extended or adjusted under 35 U.S.C. 154(b) by 255 days.

(21) Appl. No.: 17/919,413

(22) PCT Filed: Apr. 8, 2021

(86) PCT No.: PCT/KR2021/004432
§ 371 (c)(1),
(2) Date: Oct. 17, 2022

(87) PCT Pub. No.: WO2021/210848
PCT Pub. Date: Oct. 21, 2021

(65) Prior Publication Data
US 2023/0170789 A1    Jun. 1, 2023

(30) Foreign Application Priority Data
Apr. 17, 2020   (KR) .................. 10-2020-0046693

(51) Int. Cl.
*H02M 1/32* (2007.01)
*H02M 1/00* (2007.01)
*H02M 3/00* (2006.01)

(52) U.S. Cl.
CPC ........... *H02M 1/32* (2013.01); *H02M 1/0058* (2021.05); *H02M 3/01* (2021.05)

(58) Field of Classification Search
CPC ...... H02M 1/0025; H02M 1/083; H02M 3/01; H02M 3/158
See application file for complete search history.

(56) References Cited

U.S. PATENT DOCUMENTS

| | | | |
|---|---|---|---|
| 5,536,920 A * | 7/1996 | Kwon ................ | H05B 6/04 |
| | | | 219/625 |
| 7,190,596 B2* | 3/2007 | Durbaum ........... | H02M 3/1588 |
| | | | 363/16 |

(Continued)

FOREIGN PATENT DOCUMENTS

| CN | 102629831 | 8/2012 |
|---|---|---|
| CN | 110661402 | 1/2020 |

(Continued)

OTHER PUBLICATIONS

Office Action in Korean Appln. No. 2022-0081974, dated Feb. 26, 2023, 9 pages (machine English translation).

(Continued)

*Primary Examiner* — Gustavo A Rosario-Benitez
(74) *Attorney, Agent, or Firm* — Fish & Richardson P.C.

(57) ABSTRACT

A protection circuit of a resonant converter including first and second switches, where the protection circuit comprises: a comparator configured to (i) compare a direct current (DC) link voltage of the resonant converter with a voltage across both ends of one of the first or second switches and (ii) output one or more signals based on the comparison, and a microcomputer configured to detect whether zero voltage switching is performed, based on the one or more output signals from the comparator.

14 Claims, 9 Drawing Sheets

(56) References Cited

U.S. PATENT DOCUMENTS

| | | | |
|---|---|---|---|
| 2006/0086728 A1* | 4/2006 | Kim | H05B 6/062 |
| | | | 219/626 |
| 2007/0018617 A1 | 1/2007 | Endo | |
| 2007/0145907 A1* | 6/2007 | Hwang | H05B 41/2985 |
| | | | 315/224 |
| 2009/0243569 A1 | 10/2009 | Nguyen | |
| 2009/0273957 A1* | 11/2009 | Feldtkeller | H02M 1/38 |
| | | | 363/98 |
| 2009/0323375 A1 | 12/2009 | Galvano et al. | |
| 2010/0001699 A1* | 1/2010 | Dragojevic | H02M 3/157 |
| | | | 323/234 |
| 2010/0181306 A1* | 7/2010 | Gutierrez | H05B 6/062 |
| | | | 219/660 |
| 2010/0226050 A1 | 9/2010 | Koo et al. | |
| 2011/0291624 A1* | 12/2011 | Cho | H02M 7/53803 |
| | | | 323/271 |
| 2014/0286056 A1* | 9/2014 | Yoon | H02M 3/33571 |
| | | | 363/21.03 |
| 2017/0237332 A1* | 8/2017 | Takahashi | H02M 1/083 |
| | | | 323/235 |
| 2019/0348911 A1 | 11/2019 | Hamond et al. | |
| 2021/0143731 A1* | 5/2021 | Ji | H02M 1/38 |

FOREIGN PATENT DOCUMENTS

| | | |
|---|---|---|
| JP | H05236737 | 9/1993 |
| JP | 2006230104 | 8/2006 |
| JP | 2011024363 | 2/2011 |
| JP | 2019514330 | 5/2019 |
| KR | 20100100244 | 9/2010 |
| WO | WO2021210848 | 10/2021 |

OTHER PUBLICATIONS

Cong et al., "A 100V reconfigurable synchronous gate driver with comparator-based dynamic dead-time control for high-voltage high-frequency DC-DC converters," In 2015 IEEE Applied Power Electronics Conference and Exposition (APEC) Mar. 15, 2015, p. 2007-2010.

Cong et al., "A 150V monolithic synchronous gate driver with built-in ZVS detection for half-bridge converters," In 2018 IEEE Applied Power Electronics Conference and Exposition (APEC), Mar. 4, 2018, p. 1861-1864.

Cong et al., "A 2MHz 150-to-400V input 1-10 1-10 1-10 isolated DC-DC bus converter with monolithic slope-sensing ZVS detection achieving 13ns turn-on delay and 1.6W power saving," 2018 IEEE International Sqlid-State Circuits Conference, Feb. 14, 2018, 3 pages.

Extended European Search Report in European Appln. No. 21789003.7, mailed on Mar. 26, 2024, 9 pages.

International Search Report in International Appln. No. PCT/KR2021/004432, dated Jul. 19, 2021, 4 pages.

* cited by examiner (a)

(b)

(a)

(b)

(a)

(b)

Inductive Region – Normal State

Inductive Region – ZVS Failure State

Capacitive Region

PROTECTION CIRCUIT OF RESONANT CONVERTER AND OPERATION METHOD THEREOF

CROSS-REFERENCE TO RELATED APPLICATIONS

This application is a National Stage application under 35 U.S.C. § 371 of International Application No. PCT/KR2021/004432, filed on Apr. 8, 2021, which claims the benefit of Korean Patent Application No. 10-2020-0046693, filed on Apr. 17, 2020. The disclosures of the prior applications are incorporated by reference in their entirety.

TECHNICAL FIELD

The present disclosure relates to a protection circuit of a resonant converter and an operation method thereof.

BACKGROUND ART

Zero voltage switching (ZVS) refers to a process of performing a switching operation when a voltage applied to a switch is zero.

FIG. 1 is a view showing a switching method of a resonant converter.

Heat loss in a semiconductor switch provided in the resonant converter may be represented by $P_{loss}=V \times I$. Referring to a hard switching method shown in FIG. 1, a section 1 in which a voltage V and a current I overlap each other occurs. This may mean a section in which heat loss occurs.

Meanwhile, referring to a soft switching method shown in FIG. 1, it can be confirmed that the section in which the voltage V and the current I overlap each other does not occur. That is, according to the soft switching method, since the current starts to flow after the voltage drops to 0, there is no heat loss. This is called zero voltage switching.

In order to minimize the heat loss of the semiconductor switch element in the resonant converter, it is essential to achieve zero voltage switching. This is because, if a zero voltage switching failure is not detected, the semiconductor switch element may be damaged due to heat accumulation.

Meanwhile, the load of the resonant converter is generally provided with a resistor (R), an inductor (L), and a capacitor (C), and may be divided into a capacitive region and an inductive region based on a resonance frequency in which the inductor and capacitor are canceled and energy is transferred only to the resistor side.

FIG. 2 is a view showing a capacitive region and an inductive region divided based on a resonance frequency.

When a driving frequency of a switch is in a capacitive region, hard switching occurs. Accordingly, in order to achieve zero voltage switching, the driving frequency of the switch has to be controlled in an inductive region.

Meanwhile, even if the switch is driven at the frequency of the inductive region, zero voltage switching may fail. For example, even if first and second switches are asymmetrically controlled for the purpose of noise reduction, or even if the first and second switches are symmetrically controlled, a zero voltage switching failure may occur according to vessel or frequency.

As the related art, Korean Patent Application Laid-Open No. 10-2010-0100244 discloses a protection circuit for detecting a zero voltage switching failure in a capacitive region among the capacitive region and an inductive region. However, as described above, the zero voltage switching failure may occur in the inductive region as well as in the capacitive region. Accordingly, there is a need for a method by which a protection circuit of a resonant converter detects a zero voltage switching failure occurring in an inductive region as well as in a capacitive region.

In addition, in the related art, a current is sensed and used to detect a zero voltage switching failure. However, there is a problem in that the reliability of the sensing result is deteriorated due to frequency characteristics of a current sensing element or nonlinear characteristics according to a current value. Therefore, there is a need for a method for securing reliability when a protection circuit of a resonant converter detects a zero voltage switching failure.

DISCLOSURE OF INVENTION

Technical Problem

The present disclosure aims to provide a protection circuit of a resonant converter which detects a zero voltage switching failure, and an operation method thereof.

The present disclosure aims to provide a protection circuit which detects a zero voltage switching failure occurring in an inductive region as well as in a capacitive region, and an operation method thereof The present disclosure aims to improve reliability of a protection circuit which detects a zero voltage switching failure and improve reliability of an operation method thereof.

Technical Solution

A protection circuit of a resonant converter according to an embodiment of the present disclosure may include a comparator configured to compare a DC link voltage of the resonant converter with a voltage across both ends of one of first and second switches, and a microcomputer configured to detect whether zero voltage switching is performed, based on output signals of the comparator.

The protection circuit of the resonant converter may further include a dead time activation unit configured to recognize only a signal in a dead time among the output signals of the comparator, wherein the microcomputer may be configured to detect whether the zero voltage switching is performed, based on the output signal of the comparator that is recognized in the dead time.

The protection circuit of the resonant converter may further include an unstable region removal unit configured to recognize only a signal when a voltage input to the resonant converter is higher than or equal to a predetermined voltage among the output signals of the comparator.

The protection circuit of the resonant converter may further include a signal conversion unit configured to convert the output signal of the comparator into a low frequency signal.

The protection circuit of the resonant converter may further include a signal output unit configured to compare the low frequency signal converted by the signal conversion unit with a reference level and output a high signal or a low signal.

The microcomputer may be configured to detect whether the zero voltage switching is performed by using a signal output in a preset section among signals output from the signal output unit.

The protection circuit of the resonant converter may further include an unstable region removal unit configured to recognize only a signal when a voltage input to the resonant converter is higher than or equal to a predetermined voltage among the output signals of the comparator, a dead time activation unit configured to recognize only a signal at a dead time among signals recognized by the unstable region removal unit, and a signal conversion unit configured to convert the signal recognized by the dead time activation unit into a low frequency signal.

The signal conversion unit may be configured to convert a high frequency signal recognized by the dead time activation unit into a low frequency signal by charging a capacitor through a resistor having a first resistance and discharging energy charged in the capacitor through a resistor having a second resistance greater than the first resistance.

The unstable region removal unit may be configured to block a signal when the voltage input to the resonant converter is lower than the predetermined voltage among the output signals of the comparator.

An operation method of a protection circuit of a resonant converter according to an embodiment of the present disclosure may include comparing a DC link voltage of the resonant converter with a voltage across both ends of one of first and second switches, and detecting whether zero voltage switching is performed, based on output signals of the comparator.

Advantageous Effects

According to an embodiment of the present disclosure, since a zero voltage switching failure can be detected in an inductive region as well as a capacitive region, there is an advantage in that the zero voltage switching failure can be minimized.

According to an embodiment of the present disclosure, since a voltage value is sensed and used, the reliability when detecting a zero voltage switching failure is secured.

BEST MODE FOR CARRYING OUT THE INVENTION

Figure 1:
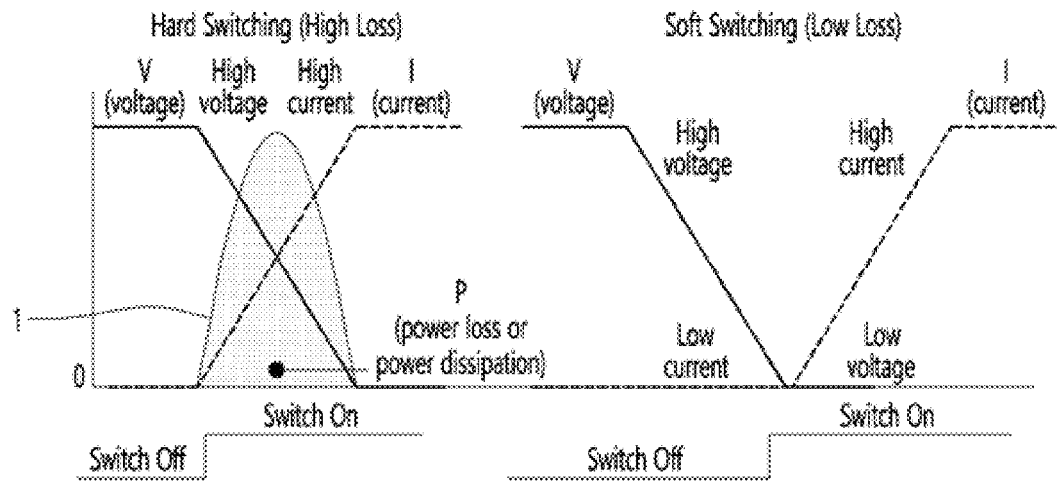
FIG. 1 is a view showing a switching method of a resonant converter.
Figure 2:
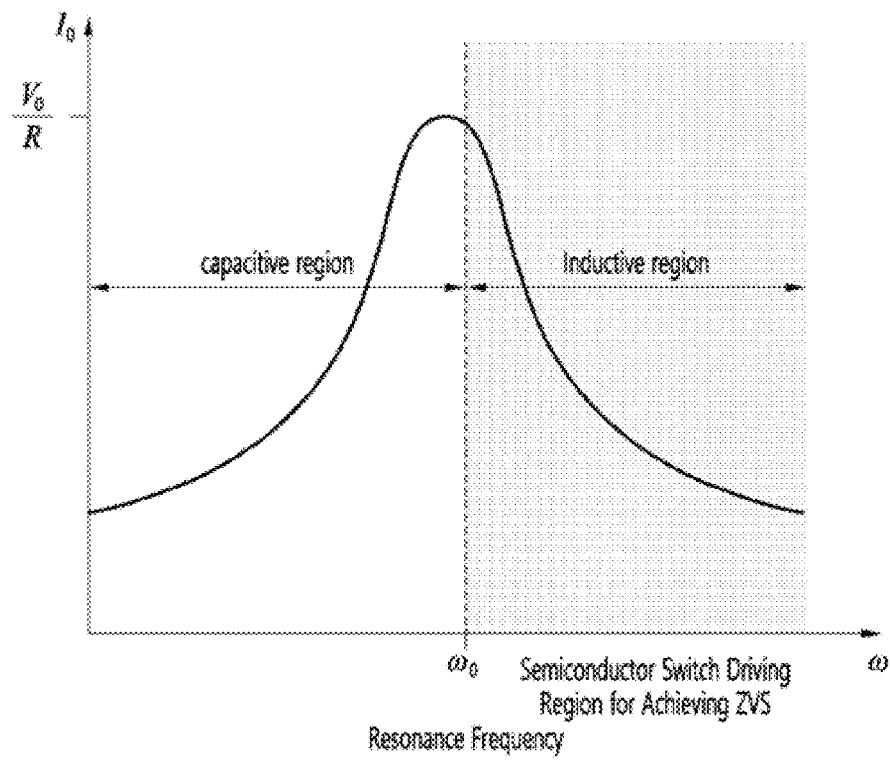
FIG. 2 is a view showing a capacitive region and an inductive region divided based on a resonance frequency.

Hereinafter, preferred embodiments of the present disclosure will be described in detail with reference to the accompanying drawings. Throughout the drawings, the same reference numerals are used to indicate the same or similar components.

Hereinafter, a protection circuit of a resonant converter and an operation method thereof according to embodiments of the present disclosure will be described.

A converter disclosed herein refers to a power conversion device that changes the shape of signals or energy, and may be interpreted as a meaning that includes both a device (a converter in a narrow sense) for converting alternating current (AC) to direct current (DC) and a device (inverter) for converting DC to AC.

First, a case where a zero voltage switching failure (non-ZVS) to be detected by the protection circuit of the resonant converter according to an embodiment of the present disclosure occurs will be described with reference to FIGS. 3 to 5.

Figure 3:
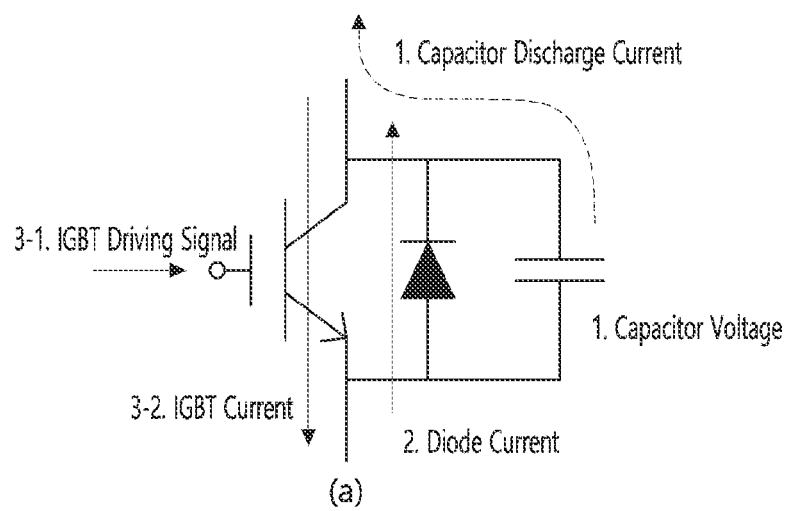
FIG. 3 is a view showing a semiconductor switch element during a zero voltage switching operation in an inductive region and a voltage and current flow in the semiconductor switch element.
Figure 3:
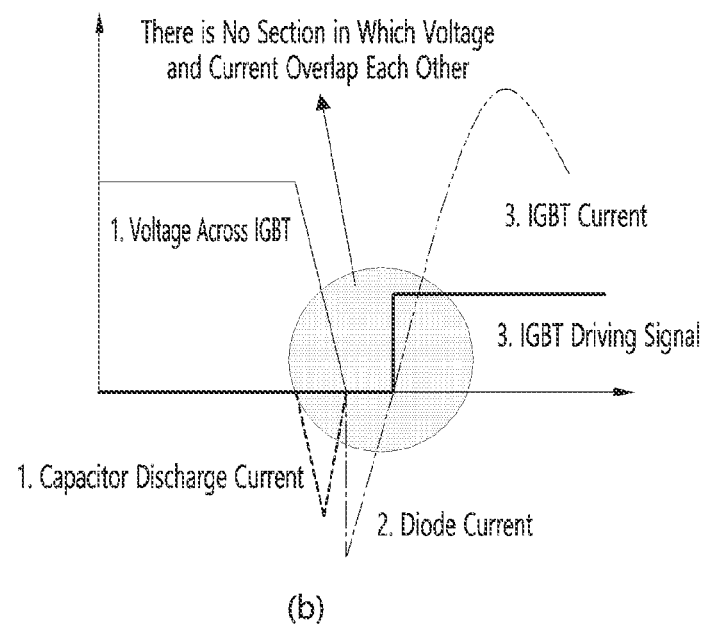
Figure 4:
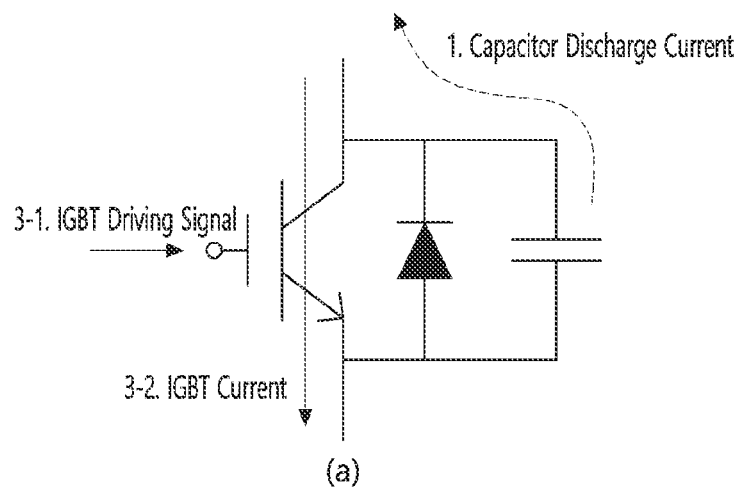
FIG. 4 is a view showing a semiconductor switch element during a zero voltage switching failure operation in a capacitive region and a voltage and current flow in the semiconductor switch element.
Figure 4:
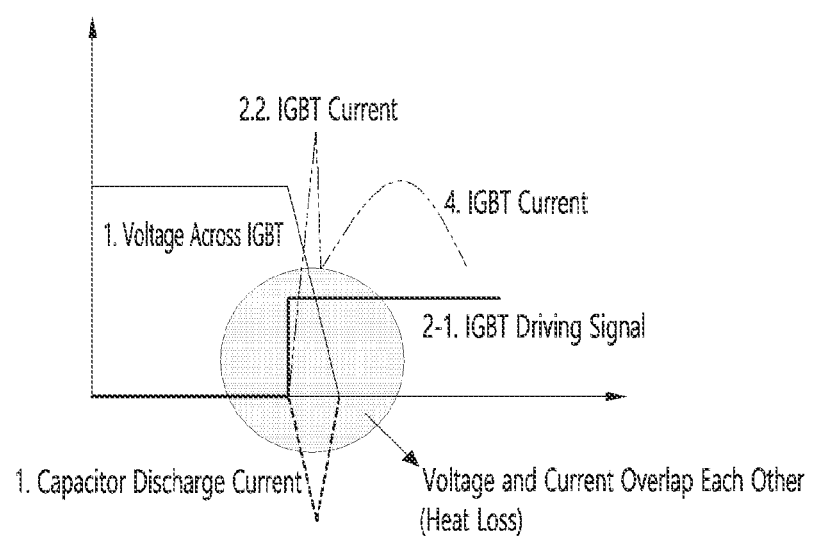
Figure 5:
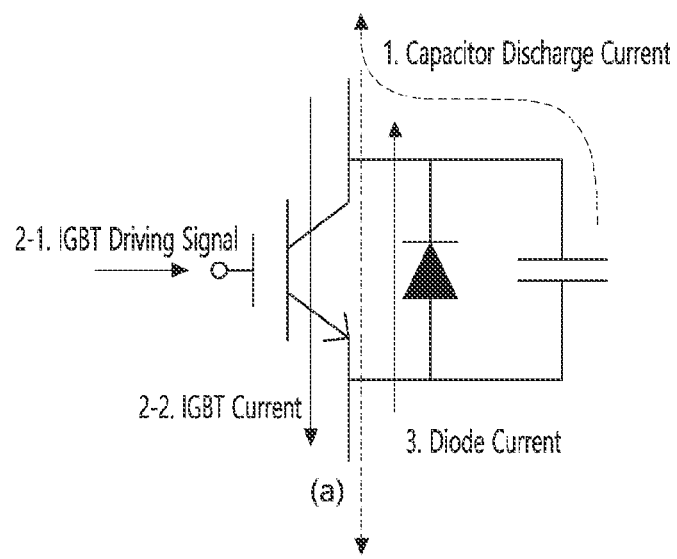
FIG. 5 is a view showing a semiconductor switch element during a zero voltage switching failure operation in an inductive region and a voltage and current flow in the semiconductor switch element.
Figure 5:
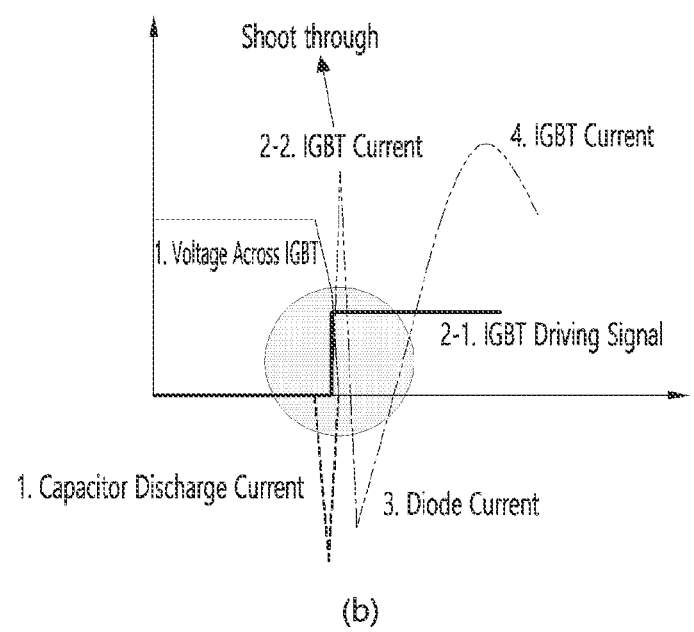

FIG. 3 is a view showing a semiconductor switch element during a zero voltage switching operation in an inductive region and a voltage and current flow in the semiconductor switch element, FIG. 4 is a view showing a semiconductor switch element during a zero voltage switching failure operation in a capacitive region and a voltage and current flow in the semiconductor switch element, and FIG. 5 is a view showing a semiconductor switch element during a zero voltage switching failure operation in an inductive region and a voltage and current flow in the semiconductor switch element.

As shown in FIGS. 3 to 5, the semiconductor switch of the resonant converter may include an insulated gate bipolar transistor (IGBT), an anti-parallel diode, and a capacitor.

Referring to FIG. 3, during the zero voltage switching operation in the inductive region, the diode is turned on after the voltage across the capacitor is completely discharged. At this time, since the current flows after the voltage across the IGBT drops to 0, a section in which the voltage and the current overlap each other does not exist, and thus, there is no heat generation problem.

Referring to FIG. 4, it can be confirmed that, since a section in which the voltage and the current of the IGBT overlap each other exists in the capacitive region, a large spike current occurs in the IGBT, thus causing a strong heat loss problem.

Meanwhile, when the semiconductor switch element is driven in the inductive region, an IGBT driving signal has to be turned on so that the current starts to flow through the IGBT after the voltage across the capacitor is completely discharged and the current flows through the diode, as shown in FIG. 3. However, as shown in FIG. 5, when the IGBT driving signal is turned on before the voltage across the capacitor is discharged, the voltage charged in the capacitor abruptly flows and a very large current flows through the IGBT toward the switch, thus causing a heat generation problem in the semiconductor element. This occurs when the timing at which the IGBT driving signal is turned on is constant but the magnitude of the load current, which determines the discharge rate of the capacitor, is too small. This is referred to as a shoot-through phenomenon. That is, in $$i_c = C\frac{dv_c}{dt} \rightarrow dt = C\frac{dv_c}{i_c},$$

$d_t$ represents the discharge time, and $i_c$ represents the load current. When the load current is too small, the discharge time increases, resulting in a zero-voltage switching failure despite being driven in the inductive region.

Accordingly, the present disclosure aims to provide a protection circuit that detects a zero voltage switching failure (non-ZVS) in a resonant converter, regardless of a cause of occurrence, and an operation method thereof. That is, the present disclosure aims to provide a protection circuit that detects both a zero voltage switching failure in a capacitive region and a zero voltage switching failure in an inductive region, and an operation method thereof.

Figure 6:
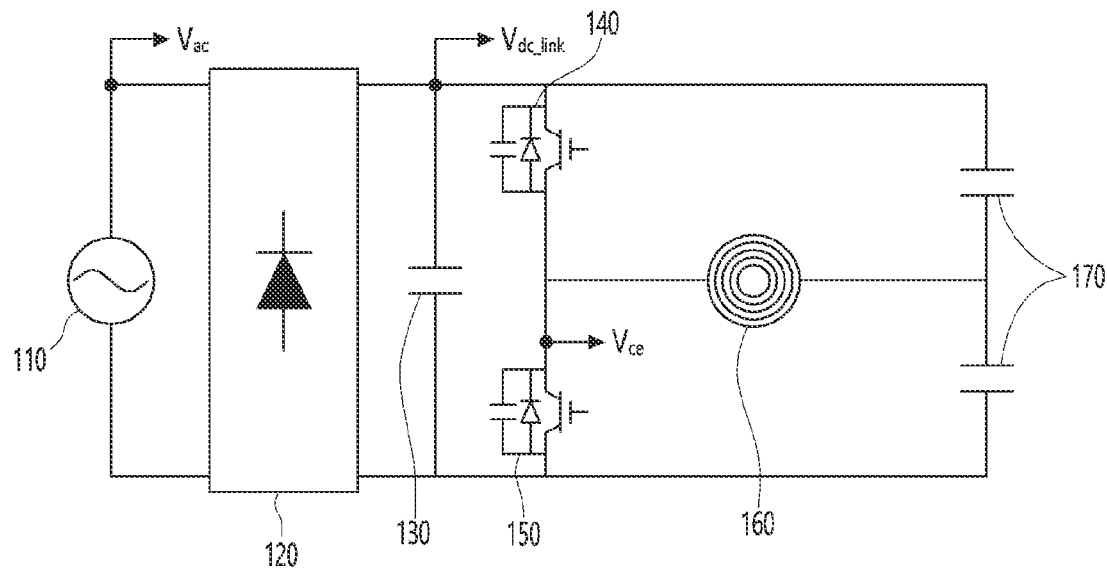
FIG. 6 is a view showing an example of a resonant converter to which a protection circuit according to an embodiment of the present disclosure is applied.

FIG. 6 is a view showing an example of a resonant converter to which a protection circuit is applied, according to an embodiment of the present disclosure.

The resonant converter to which the protection circuit according to an embodiment of the present disclosure is applied may include all or part of a power supply 110, a rectifier 120, a DC link capacitor 130, a first switch 140, a second switch 150, a coil 160, and a resonance capacitor 170.

The power supply 110 may receive AC input from the outside.

The rectifier 120 may convert the AC received through the power supply 110 into DC.

The DC link capacitor 130 may serve as a buffer between the power supply 110 and the first and second switches 140 and 150.

The first and second switches 140 and 150 may switch a voltage applied to the coil 160.

The current may be applied to the coil 160 by driving the first and second switches 140 and 150.

The resonance capacitor 170 may serve as a buffer. The resonance capacitor 170 may control a saturation voltage increase ratio while the first and second switches 140 and 150 are turned off, thereby affecting energy loss for the turned-off time.

Meanwhile, although a half-bridge converter is shown in FIG. 6, this is only an example, and the present disclosure is not limited thereto. That is, the resonant converter shown in FIG. 6 is only an example, and the resonant converter to which the protection circuit according to the embodiment of the present disclosure is applied is not limited to that shown in FIG. 6. The protection circuit according to an embodiment of the present disclosure may be applied to various types of resonant converters, such as a half-bridge converter and a full-bridge converter.

Figure 7:
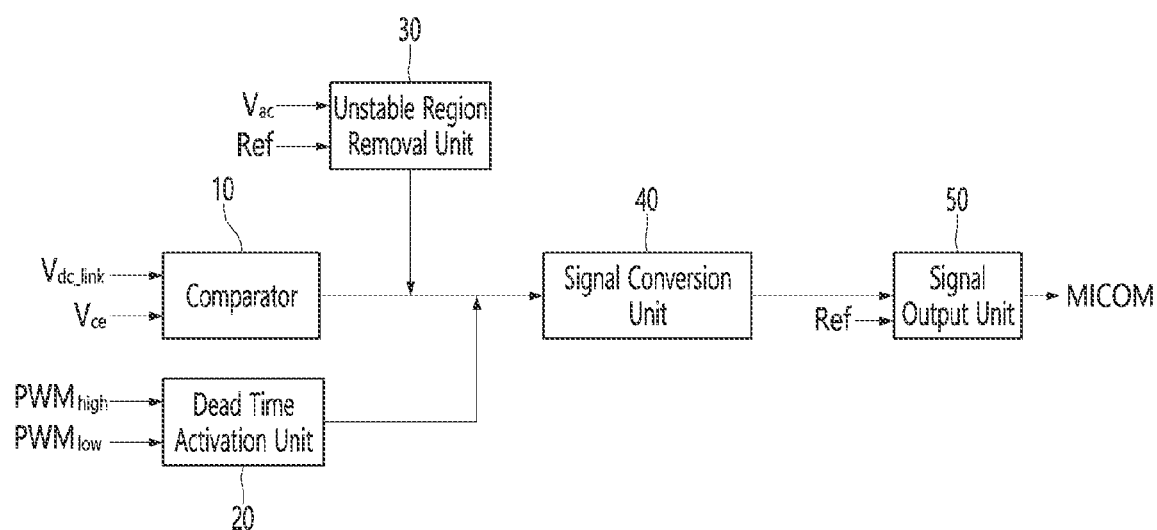
FIG. 7 is a block diagram showing a protection circuit of a resonant converter according to an embodiment of the present disclosure.

FIG. 7 is a block diagram showing a protection circuit of a resonant converter according to an embodiment of the present disclosure.

The protection circuit of the resonant converter according to an embodiment of the present disclosure may include all or part of a comparator 10, a dead time activation unit 20, an unstable region removal unit 30, a signal converting unit 40, a signal output unit 50, and a microcomputer (MICOM). Meanwhile, some of the components shown in FIG. 7 may be omitted, or other components may be further added.

The comparator 10 may compare a DC link voltage Vdc_link of the resonant converter with a voltage across both ends of one of the first and second switches 140 and 150.

The DC link voltage Vdc_link may refer to a voltage across both ends of the DC link capacitor 130.

Accordingly, the comparator 10 may compare the DC link voltage Vdc_link with the voltage across both ends of the first switch 140, or may compare the DC link voltage Vdc_link with the voltage across both ends of the second switch 150. Hereinafter, although it is assumed that the comparator 10 compares the DC link voltage Vdc_link with a collector-emitter voltage Vce of the IGBT of the second switch 150, the comparator 10 may compare the DC link voltage Vdc_link with a collector-emitter voltage of the IGBT of the first switch 140.

The first switch 140 and the second switch 150 may be alternately turned on and off. 0 V and the DC link voltage Vdc_link may repeatedly appear as the voltage across both ends of the first switch 140 according to a PWM signal. Similarly, 0 V and the DC link voltage Vdc_link may repeatedly appear as the voltage Vce across both ends of the second switch 150 according to the PWM signal.

The comparator 10 may compare the DC link voltage Vdc_link with the collector-emitter voltage Vce of the IGBT of the second switch 150 at the dead time.

The dead time may refer to a section in which both the voltage across both ends of the first switch 140 and the voltage across both ends of the second switch 150 are zero. That is, the dead time may refer to a section in which both the first switch 140 and the second switch 150 are turned off.

The comparator 10 may determines a normal operation when the voltage Vce across both ends of the second switch 150 reaches the DC link voltage Vdc_link for the dead time, and may determine a zero voltage switching failure when the voltage Vce across both ends of the second switch 150 does not reach the DC link voltage Vdc_link for the dead time.

Figure 8:
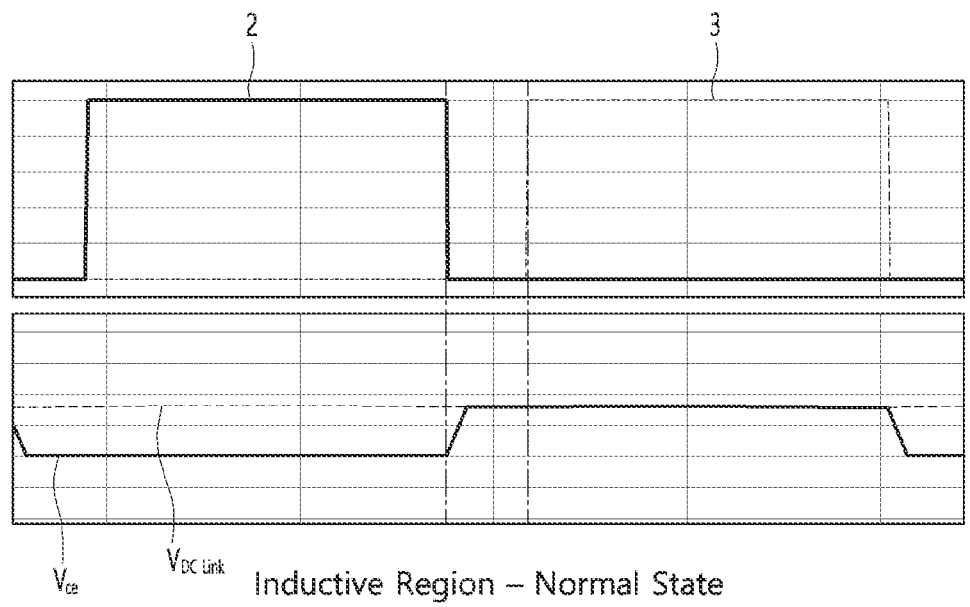
FIG. 8 is a view showing a DC link voltage and a voltage across both ends of a switch when zero voltage switching is performed during an operation in an inductive region.
Figure 9:
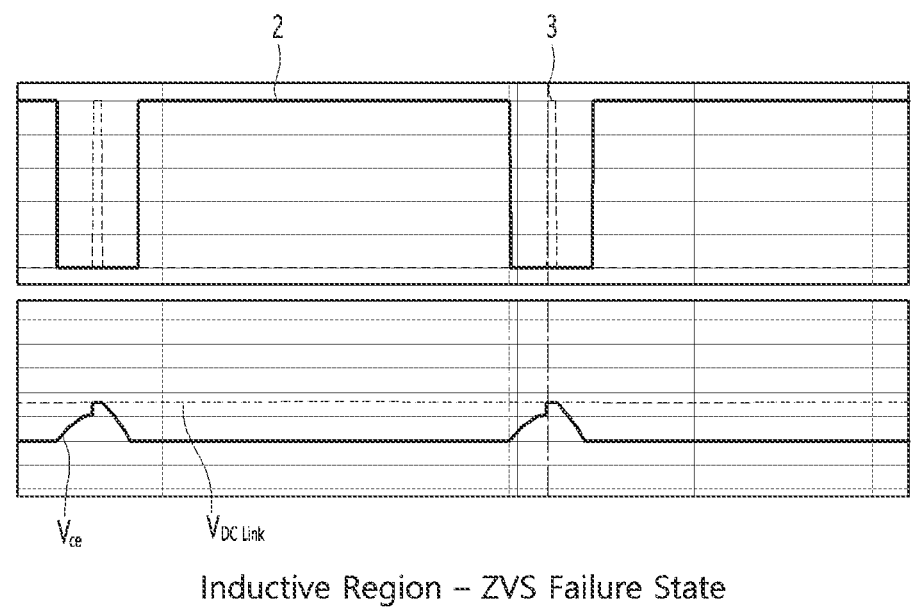
FIG. 9 is a view showing a DC link voltage and a voltage across both ends of a switch when zero voltage switching fails during an operation in an inductive region.
Figure 10:
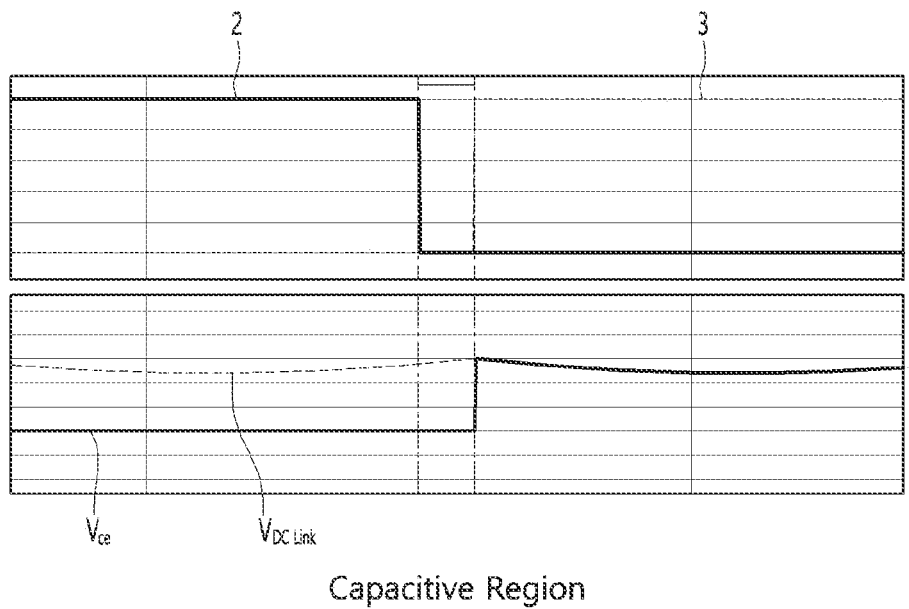
FIG. 10 is a view showing a DC link voltage and a voltage across both ends of a switch during an operation in a capacitive region.

FIGS. 8 to 10 are views showing the DC link voltage and the voltage across both ends of the switch for the dead time of the resonant converter.

Specifically, FIG. 8 is a view showing a DC link voltage and a voltage across both ends of a switch when zero voltage switching is performed during an operation in an inductive region, FIG. 9 is a view showing a DC link voltage and a voltage across both ends of a switch when zero voltage switching fails during an operation in an inductive region, and FIG. 10 is a view showing a DC link voltage and a voltage across both ends of a switch during an operation in a capacitive region.

In FIGS. 8 to 10, a first PWM signal 2 may represent a gate signal of the second switch 150, and a second PWM signal 3 may represent a gate signal of the first switch 140.

In FIGS. 8 to 10, the dead time may refer to a section in which both the first PWM signal 2 and the second PWM signal 3 are turned off.

Referring to FIG. 8, it can be confirmed that the voltage Vce across both ends of the second switch gradually rises to reach the DC link voltage Vdc_link for the dead time during the normal operation. Referring to FIG. 9, it can be confirmed that, in the inductive region or when zero voltage switching fails, the voltage Vce across both ends of the second switch gradually rises, but the dead time ends before reaching the DC link voltage Vdc_link. Referring to FIG. 10, it can be confirmed that, in the capacitive region, the voltage Vce across both ends of the second switch continues to be 0 V.

Accordingly, the comparator 10 may output a signal obtained by comparing the voltage Vce across the second switch 150 and the DC link voltage Vdc_link for the dead time.

Meanwhile, since the dead time is as very short as about 1 to 2 us, the output signal of the comparator 10 may also be very short.

Accordingly, the protection circuit according to an embodiment of the present disclosure may include the dead time activation unit 20 that recognizes only a signal at the dead time among the output signals of the comparator 10.

The dead time activation unit 20 inputs the output signal of the comparator 10 to the microcomputer only at the dead time. The dead time activation unit 20 may recognize only a signal at the dead time among the signals that are output from the comparator 10 and then recognized by the unstable region removal unit 30.

Figure 11:
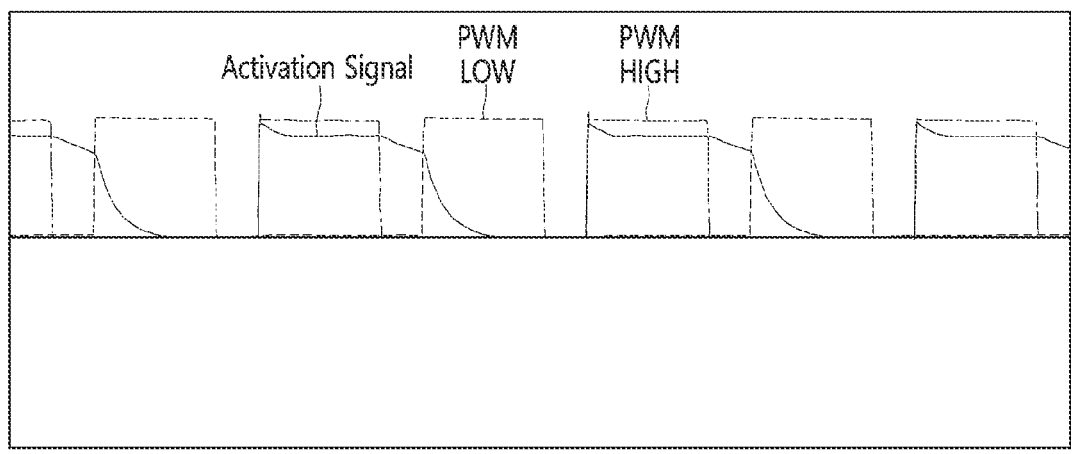
FIG. 11 is a view showing an example of a waveforms for explaining an operation method of a dead time activation unit of a protection circuit according to an embodiment of the present disclosure.

FIG. 11 is a view showing an example of a waveforms for explaining an operation method of the dead time activation unit of the protection circuit according to an embodiment of the present disclosure.

In FIG. 11, PWM HIGH may represent the PWM signal of the first switch 140, and PWM LOW may represent the PWM signal of the second switch 150. In the present disclosure, since it is assumed that the comparator 10 compares the DC link voltage Vdc_link with the voltage Vce across both ends of the second switch 150, the dead time activation unit 20 may activate only the dead time immediately after the PWM signal of the second switch 150 is changed from the turned-on state to the turned-off state. When it is assumed that the comparator 10 compares the DC link voltage Vdc_link with the voltage Vce across both ends of the first switch 140, the dead time activation unit 20 may activate only the dead time immediately after the PWM signal of the second switch 140 is changed from the turned-on state to the turned-off state.

The dead time activation unit 20 may activate only a necessary signal by outputting an activation signal. For example, the dead time activation unit 20 may control, to 0 (off), the signal in the section in which the activation signal is output, so that the signal corresponding to the section in which the activation signal is output is deactivated and only the signal in the section in which the activation signal is 0 V is extracted. In this case, referring to FIG. 11, all signals in the section in which the activation signal is output are recognized as 0, and only the signal can be activated in the section in which the activation signal is 0 V, that is, at the dead time immediately after PWM LOW and immediately before PWM HIGH. In PWM LOW, the voltage Vce across both ends of the second switch 150 is 0 V. Accordingly, there is no problem even if the activation signal is output.

In summary, the dead time activation unit 20 may activate only the signal at the dead time immediately after the PWM signal of the second switch 150 is changed from the turned-on state to the turned-off state among the output signals of the comparator 10. That is, the dead time activation unit 20 may output 0 as the signal in the remaining sections excluding the dead time immediately after the PWM signal of the second switch 150 is changed from the turned-on state to the turned-off state among the output signals of the comparator 10.

Meanwhile, the comparator 10 outputs a signal corresponding to a result of comparing the DC link voltage Vdc_link with the voltage across both ends of one of the first and second switches 140 and 150. When the magnitude of the DC link voltage Vdc_link is very small, the reliability of the output signal of the comparator 10 may be deteriorated. For example, when the DC link voltage Vdc_link is low close to 0 V, the reliability of the output signal of the comparator 10 is deteriorated.

Accordingly, the unstable region removal unit 30 may recognize only a signal when the voltage input to the resonant converter is higher than or equal to a predetermined voltage among the output signals of the comparator 10. Accordingly the unstable region removal unit 30 may process a signal to 0 when the voltage input to the resonant converter is lower than the predetermined voltage among the output signals of the comparator 10. That is, the unstable region removal unit 30 may block a signal when the voltage input to the resonant converter is lower than the predetermined voltage among the output signals of the comparator 10.

In this manner, the unstable region removal unit 30 ignores the output signal of the comparator 10 when the magnitude of the AC voltage input through the power supply 110 is smaller than the predetermined voltage, thereby improving the reliability of the protection circuit.

Meanwhile, in a case where the unstable region removal unit 30 blocks the output of the comparator 10 when the magnitude of the AC voltage input through the power supply 110 is smaller than the predetermined voltage, there is an effect that the energy charged in the capacitor is reset when the output signal of the comparator 10 is converted into a low frequency signal.

Next, the signal conversion unit 40 for converting the output signal of the comparator 10 into the low frequency signal will be described.

Since the signals of the first and second switches 140 and 150 are repeated at the switching frequency, the output signal of the comparator 10 may be output as a high frequency signal. The high frequency signal needs to be converted into the low frequency signal so that the microcomputer can recognize the high frequency signal well.

The signal conversion unit 40 may convert the output signal of the comparator 10 into the low frequency signal.

The signal conversion unit 40 may convert the signal, which is recognized by the dead time activation unit 20 among the output signals of the comparator 10, into the low frequency signal. For example, the signal conversion unit 40 may convert the high frequency signal recognized by the dead time activation unit 20 into the low frequency signal by charging the capacitor through a resistor having a first resistance and discharging the energy charged in the capacitor through a resistor having a second resistance greater than the first resistance.

Figure 12:
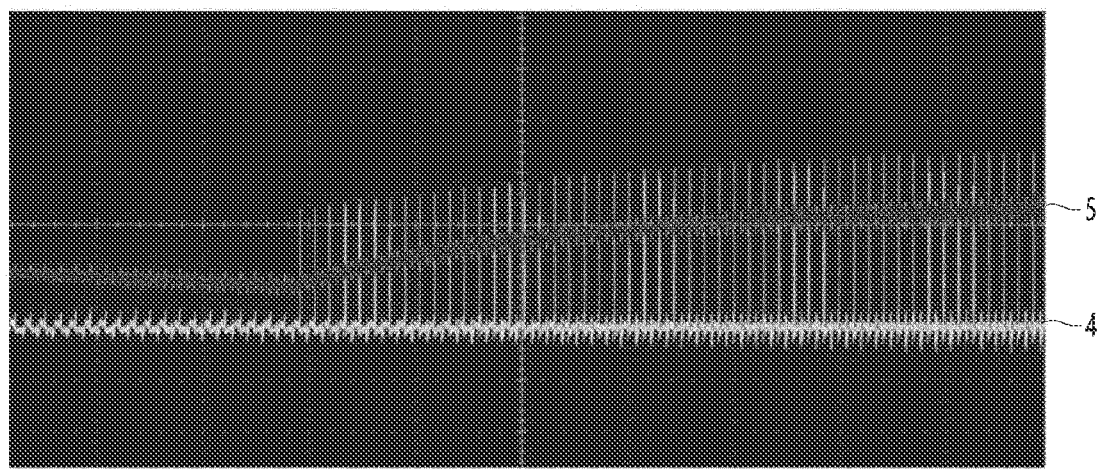
FIGS. 12 and 13 are views showing an example of a waveforms for explaining an operation method of a signal conversion unit of a protection circuit according to an embodiment of the present disclosure.
Figure 13:
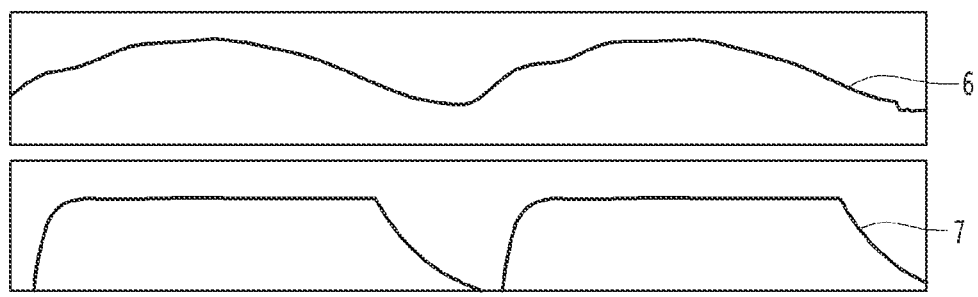

Next, FIGS. 12 and 13 are views showing an example of a waveforms for explaining the operation method of the signal conversion unit of the protection circuit according to an embodiment of the present disclosure.

Referring to FIG. 12, when the signal input to the signal conversion unit 40 is the same as a first waveform 4, the signal conversion unit 40 may output a second signal 5. That is, when a high frequency signal such as the first waveform 4 is input, the signal conversion unit 40 may output the second waveform 5 in which the same energy level as the second waveform 5 gradually increases through continuous charging and discharging. Therefore, when the voltage Vce across both ends of the second switch 150 and the DC link voltage Vdc_link as in a first graph 6 of FIG. 13 are input to the protection circuit, the signal conversion unit 40 may output a low frequency signal such as a second graph 7.

The signal output unit 50 may compare the low frequency signal converted by the signal conversion unit 40 with a reference level and output a high or low signal.

Figure 14:
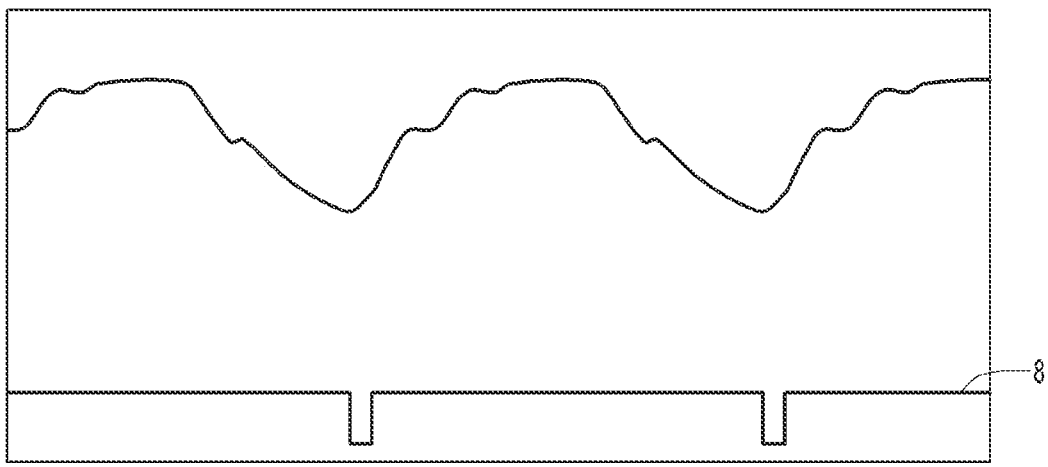
FIG. 14 is a view showing an example of a waveforms for explaining an operation method of a signal output unit of a protection circuit according to an embodiment of the present disclosure.

FIG. 14 is a view showing an example of a waveforms for explaining the operation method of the signal output unit of the protection circuit according to an embodiment of the present disclosure.

The signal output unit 50 compares the input signal with the reference level. The signal output unit 50 may output high when the level of the input signal is higher than the reference level, and may output low when the level of the input signal is lower than the reference level. This may be the same as an output waveform 8 shown in the example of FIG. 14.

The signal output from the signal output unit 50 may be input to the microcomputer.

The microcomputer may detect whether the zero voltage switching is performed, based on the output signal of the comparator 10.

Specifically, the microcomputer may detect the zero voltage switching by using the signal that is output from the comparator 10, is extracted by the unstable region removal unit 30 and the dead time activation unit 20, is converted by the signal conversion unit 40, and is output by the signal output unit 50. That is, the microcomputer may detect the zero voltage switching based on the output signal of the comparator recognized by the dead time activation unit 20 among the output signals of the comparator.

Figure 15:
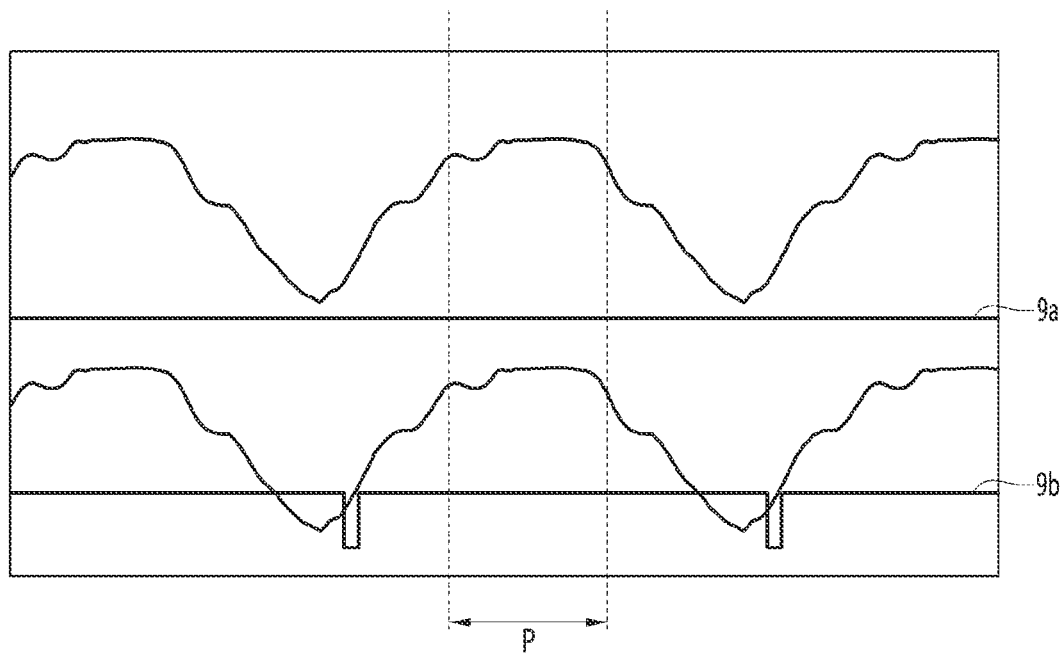
FIG. 15 is a view showing an example of signals input to a microcomputer of a protection circuit according to an embodiment of the present disclosure.

FIG. 15 is a view showing an example of signals input to the microcomputer of the protection circuit according to an embodiment of the present disclosure.

In FIG. 15, a first output waveform 9a may be a signal input to the microcomputer when the zero voltage switching fails, and a second output waveform 9b may be a signal input to the microcomputer when the zero voltage switching is performed.

The microcomputer may detect the zero voltage switching based on a signal output in a predetermined section P among signals output from the signal output unit 50. For example, the microcomputer detects a normal operation (zero voltage switching) when the signal input to the microcomputer in the predetermined section P is high, and may detect a zero voltage switching failure when the signal input to the microcomputer in the predetermined period P is low.

Meanwhile, according to the type of the signal input to the comparator 10, the microcomputer detects a normal operation (zero voltage switching) when the signal input to the microcomputer in the predetermined section P is low, and may detect a zero voltage switching failure when the signal input to the microcomputer in the predetermined period P is high. That is, the method of detecting the zero voltage switching failure based on the signal input to the microcomputer may vary depending on the detailed design of the protection circuit, and it is obvious that the present disclosure is not limited thereto.

In this case, the protection circuit according to an embodiment of the present disclosure has an advantage that can detect the zero voltage switching failure regardless of the cause of the zero voltage switching failure in the resonant converter (for example, when driven in capacitive region, the load current is small even though driven in inductive region). In addition, since the protection circuit detects the zero voltage switching failure by using a voltage instead of a current, the reliability is improved. In addition, when applied to a converter, a switching frequency of which is driven at a high frequency of 20 kHz or higher, such as an induction heating (IH) cooktop, the microcomputer detects the zero voltage switching by receiving the low frequency converted signal. Therefore, there is an advantage that can secure the reliability and can reduce the burden on the microcomputer. Since the zero voltage switching failure can be detected through the protection circuit, there is an advantage that can more accurately recognize the frequency variable range of the resonant converter and can transmit maximum power. In other words, since the zero voltage switching failure can be detected through the protection circuit, there is an advantage that can more accurately transmit power by recognizing the driving range of asymmetric switching control and PWM control. In addition, since the asymmetric switching control is possible through the application of the protection circuit, there is an advantage that can minimize the interference noise between burners.

The above description is merely illustrative of the technical spirit of the present disclosure, and various modifications and changes can be made by those of ordinary skill in the art, without departing from the scope of the present disclosure.

Therefore, the embodiments disclosed in the present disclosure are not intended to limit the technical spirit of the present disclosure, but are intended to explain the technical spirit of the present disclosure. The scope of the technical spirit of the present disclosure is not limited by these embodiments.

The scope of the present disclosure should be interpreted by the appended claims, and all technical ideas within the scope equivalent thereto should be construed as falling within the scope of the present disclosure.

The invention claimed is:

1. A protection circuit of a resonant converter including first and second switches, the protection circuit comprising:
- a comparator configured to (i) compare a direct current (DC) link voltage of the resonant converter with a voltage across both ends of one of the first or second switches that switches a voltage to a coil and (ii) output one or more signals based on the comparison;
- a microcomputer configured to detect whether zero voltage switching is performed and whether the zero voltage switching has failed, based on the one or more output signals from the comparator;
- an unstable region removal unit configured to detect, among the one or more output signals, one or more signals indicating that a voltage input to the resonant converter is greater than or equal to a predetermined voltage;
- a dead time activation unit configured to detect a signal at a dead time among the one or more signals detected by the unstable region removal unit; and
- a signal conversion unit configured to convert the signal detected by the dead time activation unit into a low frequency signal.

2. The protection circuit of the resonant converter of claim 1,
wherein the microcomputer is configured to detect whether the zero voltage switching is performed and whether the zero voltage switching has failed, based on the signal that is detected in the dead time among the one or more output signals from the comparator.

3. The protection circuit of the resonant converter of claim 1, further comprising the signal conversion unit configured to convert the output signal from the comparator into a low frequency signal.

4. The protection circuit of the resonant converter of claim 3, further comprising a signal output unit configured to (i) compare the low frequency signal with a reference level and (ii) output a high signal or a low signal based on the comparison.

5. The protection circuit of the resonant converter of claim 4, wherein the microcomputer is configured to detect whether the zero voltage switching is performed and whether the zero voltage switching has failed, based on a signal in a preset section among the high or low signals from the signal output unit.

6. The protection circuit of the resonant converter of claim 1, wherein the signal conversion unit is configured to convert a high frequency signal detected by the dead time activation unit into the low frequency signal by charging a capacitor through a resistor having a first resistance and discharging energy charged in the capacitor through another or second resistor having a second resistance greater than the first resistance.

7. The protection circuit of the resonant converter of claim 6, wherein the unstable region removal unit is configured to block, among the one or more output signals, a signal indicating that the voltage input to the resonant converter is less than the predetermined voltage.

8. An operation method of a protection circuit of a resonant converter including first and second switches, the operation method comprising:
comparing a direct current (DC) link voltage of the resonant converter with a voltage across both ends of one of the first and second switches that switches a voltage to a coil;
outputting one or more signals based on the comparison;
detecting whether zero voltage switching is performed and whether the zero voltage switching has failed, based on the one or more output signals;
detecting, among the one or more output signals, one or more signals indicating that a voltage input to the resonant converter is greater than or equal to a predetermined voltage;
detecting a signal at a dead time among the detected one or more signals; and
converting the detected signal into a low frequency signal.

9. The operation method of claim 8,
wherein detecting whether zero voltage switching is performed comprises detecting whether the zero voltage switching is performed and whether the zero voltage switching has failed, based on the output signal detected in the dead time.

10. The operation method of claim 8, further comprising converting the output signal into a low frequency signal.

11. The operation method of claim 10, further comprising:
comparing the converted low frequency signal with a reference level; and
outputting a high signal or a low signal based on the comparison.

12. The operation method of claim 11, wherein detecting whether the zero voltage switching is performed comprises detecting whether the zero voltage switching is performed and whether the zero voltage switching has failed, based on a signal in a preset section among the high or low signals.

13. The operation method of claim 8, wherein converting the detected signal into the low frequency signal comprises converting the detected signal at the dead time into the low frequency signal by charging a capacitor through a resistor having a first resistance and discharging energy charged in the capacitor through another or second resistor having a second resistance greater than the first resistance.

14. The operation method of claim 13, further comprising blocking, among the one or more output signals, a signal indicating that the voltage input to the resonant converter being less than the predetermined voltage.

* * * * *